United States Patent
Wang et al.

(10) Patent No.: US 6,716,690 B1
(45) Date of Patent: Apr. 6, 2004

(54) UNIFORMLY DOPED SOURCE/DRAIN JUNCTION IN A DOUBLE-GATE MOSFET

(75) Inventors: Haihong Wang, Fremont, CA (US); Judy Xilin An, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/385,692

(22) Filed: Mar. 12, 2003

(51) Int. Cl.[7] ................ H01L 21/336; H01L 21/00; H01L 21/8238; H01L 21/331; H01L 21/20
(52) U.S. Cl. ................ 438/197; 438/149; 438/151; 438/230; 438/231; 438/232; 438/303; 438/311; 438/479; 438/495; 438/514; 438/519; 438/682; 438/914
(58) Field of Search ................ 438/149, 151, 438/197, 230, 231, 232, 303, 311, 479, 495, 514, 519, 682, 914

(56) References Cited

U.S. PATENT DOCUMENTS

| | | | | |
|---|---|---|---|---|
| 5,500,379 A | * | 3/1996 | Odake et al. | 438/217 |
| 5,516,711 A | * | 5/1996 | Wang | 438/217 |
| 5,750,435 A | * | 5/1998 | Pan | 438/525 |
| 5,793,090 A | * | 8/1998 | Gardner et al. | 257/408 |
| 5,891,774 A | * | 4/1999 | Ueda et al. | 438/264 |
| 6,083,795 A | * | 7/2000 | Liang et al. | 438/289 |
| 6,297,098 B1 | * | 10/2001 | Lin et al. | 438/264 |
| 6,300,182 B1 | * | 10/2001 | Yu | 438/217 |
| 6,413,802 B1 | * | 7/2002 | Hu et al. | 438/151 |
| 6,509,264 B1 | * | 1/2003 | Li et al. | 438/682 |
| 6,521,502 B1 | * | 2/2003 | Yu | 438/305 |
| 2002/0195626 A1 | * | 12/2002 | Tran et al. | 257/285 |

OTHER PUBLICATIONS

Digh Hisamoto et al.: "FinFET—A Self–Aligned Double–Gate MOSFET Scalable to 20 nm," IEEE Transactions on Electron Devices, vol. 47, No. 12, Dec. 2000, pp. 2320–2325.
Yang–Kyu Choi et al.: "Sub–20nm CMOS Fin FET Technologies," 0–7803–5410–9/99 IEEE, Mar. 2001, 4 pages.
Xuejue Huang et al.: "Sub–50 nm P–Channel Fin FET," IEEE Transactions on Electron Devices, vol. 48, No. 5, May 2001, pp. 880–886.
Yang–Kyu Choi et al.: "Nanoscale CMOS Spacer FINFET for the Terabit Era," IEEE Electron Device Letters, vol. 23, No. 1, Jan. 2002, pp. 25–27.
Zuejue Huang et al.: "Sub 50–nm FInFET: PMOS," 0–7803–7050–3/01 IEEE, Sep. 1999 4 pages.

* cited by examiner

*Primary Examiner*—John F. Niebling
*Assistant Examiner*—Stanetta Isaac
(74) *Attorney, Agent, or Firm*—Harrity & Snyder, LLP

(57) ABSTRACT

Multiple dopant implantations are performed on a FinFET device to thereby distribute the dopant in a substantially uniform manner along a vertical depth of the FinFET in the source/drain junction. Each of the multiple implantations may be performed at different tilt angles.

20 Claims, 10 Drawing Sheets

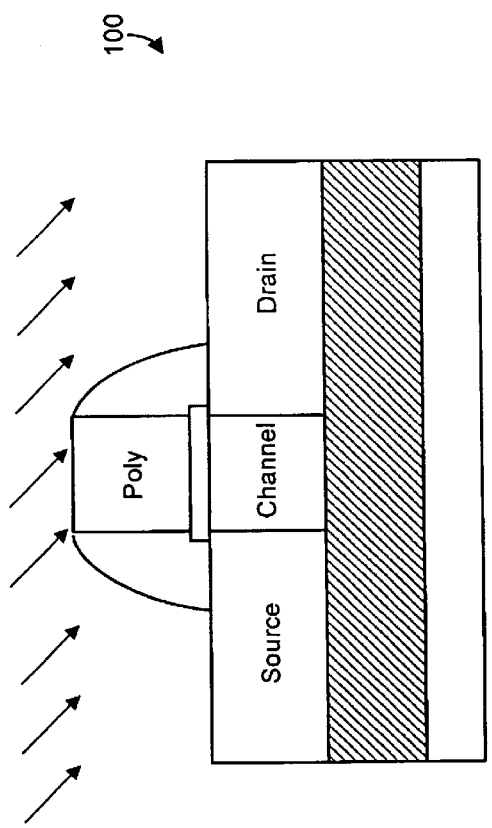
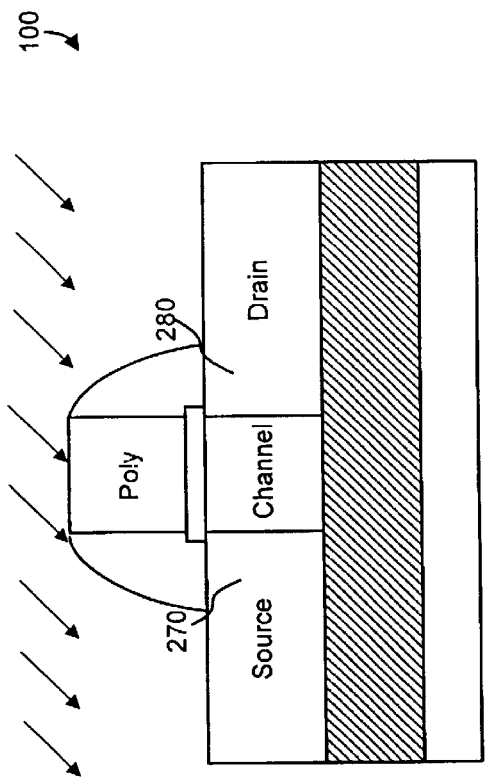

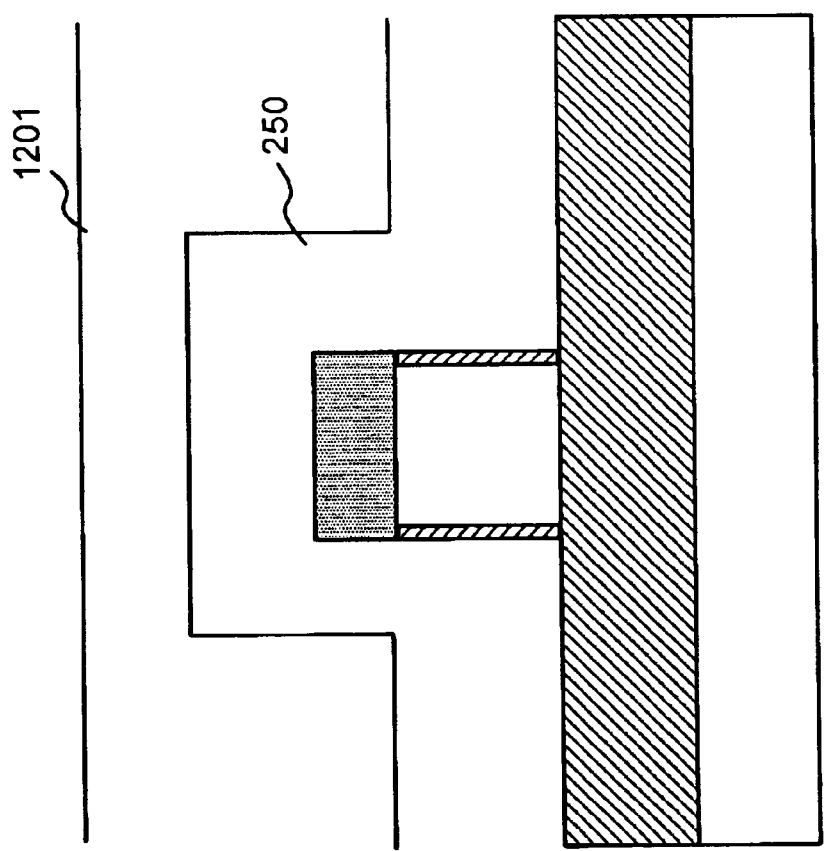

US 6,716,690 B1

UNIFORMLY DOPED SOURCE/DRAIN JUNCTION IN A DOUBLE-GATE MOSFET

BACKGROUND OF THE INVENTION

A. Field of the Invention

The present invention relates generally to semiconductor manufacturing and semiconductor devices and, more particularly, to double gate metal-oxide semiconductor field-effect transistors (MOSFETs).

B. Description of Related Art

Transistors, such as MOSFETs, are the core building block of the vast majority of semiconductor devices. Some semiconductor devices, such as high performance processors, can include millions of transistors. For these devices, decreasing transistor size, and thus increasing transistor density, has traditionally been a high priority in the semiconductor manufacturing area.

Conventional MOSFETs have difficulty scaling below 50 nm fabrication processing. To develop sub-50 nm MOSFETs, double-gate MOSFETs have been proposed. In several respects, the double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET, as the term is used herein, refers to a type of double-gate MOSFET in which a conducting channel is formed in a vertical Si "fin" controlled by a self-aligned double-gate. FinFETs are known in the art. FinFETs tend to scale well to small device dimensions and may thus be desirable when designing semiconductor integrated circuits.

SUMMARY OF THE INVENTION

Implementations consistent with the present invention include a FinFET having vertically uniform dopant concentrations in the source/drain junction, and methods of manufacturing the same.

One aspect of the invention is directed to a method for forming a MOSFET. The method includes forming a source, a drain, and a fin structure on an insulating layer, portions of the fin structure acting as a channel for the MOSFET. The method further includes performing a first implantation with a first dopant of the source and the drain; and performing a second implantation with the first dopant of the source and the drain, the second implantation being performed at a tilt angle different than a tilt angle of the first implantation.

In another implementation consistent with principles of the invention, a method includes forming a source, a drain, and a fin structure on an insulating layer, portions of the fin structure acting as a channel for the MOSFET. The method further includes implanting the source and the drain with a first dopant using a number of implantation steps in which each of the implantation steps is performed at different tilt angles, wherein the implantation steps cause a concentration of the first dopant to be substantially uniform along a vertical depth of a junction of the source and the drain.

BRIEF DESCRIPTION OF THE DRAWINGS

Reference is made to the attached drawings, wherein elements having the same reference number designation may represent like elements throughout.

FIGS. 5–8 are cross-sectional views taken along the line B–B' in FIG. 1;

FIGS. 12A and 12B are cross-sectional views illustrating the application of a spin-on-glass layer prior to gate patterning.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A FinFET is described that has a relatively uniform dopant concentration in the source/drain junction. The uniform dopant concentration is achieved through multiple tilted implantations. The uniform dopant concentration can be advantageous as it may provide for uniform channel length along the width and better short channel control.

Figure 1:
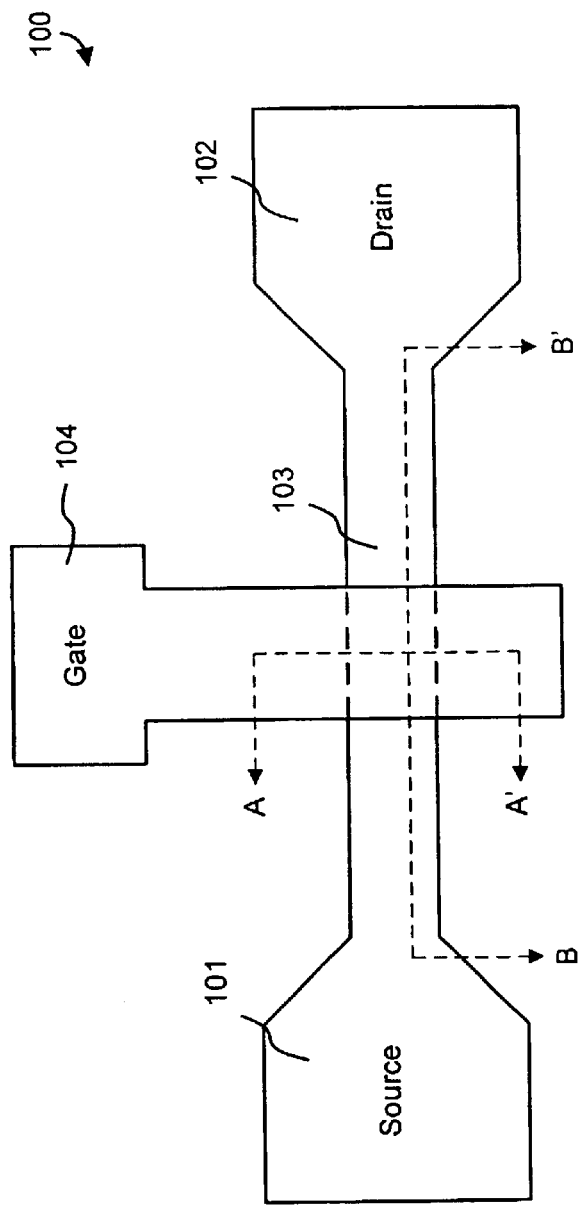
FIG. 1 is a top-level view of a FinFET.
Figure 2:
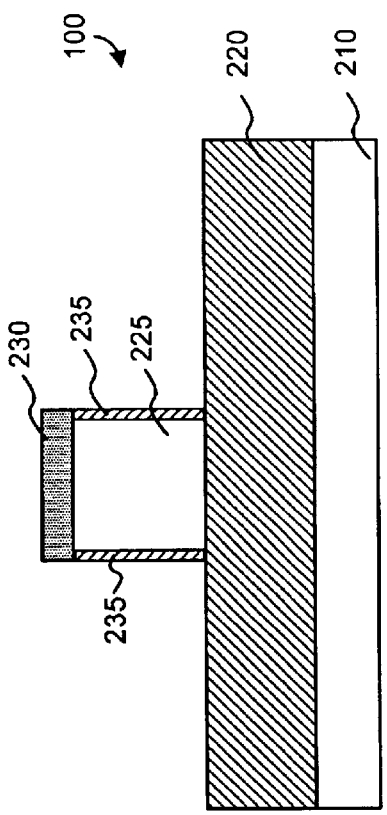
FIGS. 2 and 3 are cross-sectional views of the FinFET of FIG. 1 taken along the line A–A'.
Figure 3:
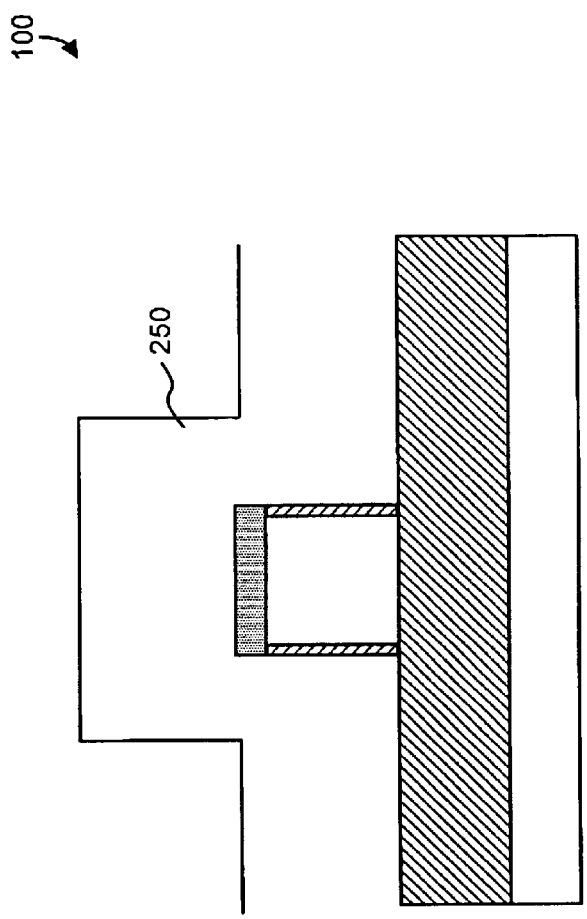

FIG. 1 is a top-level view of a FinFET 100 consistent with principles of the invention. FinFET 100 includes a source region 101, a drain region 102, a gate 104, and a fin 103. The portion of fin 103 that is under gate 104 is the channel for the transistor. FIGS. 2 and 3 are cross-sectional views taken along the line A–A' in FIG. 1. FIGS. 5–8 are cross-sectional views taken along the line B–B' in FIG. 1. FIGS. 2, 3, and 5–8 each illustrate steps in the manufacturing process of FinFET 100.

Referring to FIG. 2, FinFET 100 may be a silicon on insulator (SOI) device that includes a silicon substrate 210 and a buried oxide (BOX) layer 220 disposed on the silicon substrate 210. Substrate 210 may alternatively comprise gernanium, metals, or combinations of such materials, such as silicon-germanium. Buried oxide layer 220 may be formed on silicon substrate 210 in a conventional manner.

A silicon layer may be disposed on BOX layer 220 and etched to create the source, drain, and fin 225 (source and drain not shown in FIG. 2). Alternatively, source/drain regions 101 and 102 may be formed by depositing silicon and etching the silicon after the fin 225 is formed. In one implementation, fin 225 may range from, for example, approximately 10 nm to about 30 nm in width. Before etching fin 225, a silicon dioxide ($SiO_2$) or silicon nitride ($Si_3N_4$) layer 230 may be deposited via chemical vapor deposition (CVD) on fin 225. Layer 230 protects fin 225 during the fabrication process, and may be, for example, deposited to a thickness ranging from about 10 nm to 20 nm.

By oxidizing the silicon surface of fin 225, gate dielectric layers 235 may be grown on the side surfaces of fin 225. The width of gate dielectric layers 235 may range from about 0.8 to about 2 nm.

FIG. 3 is a cross-sectional view of FinFET 100 after deposition of gate material layer 250. Gate material layer 250 may be polysilicon or another similar type of material. This layer forms the portion of gate 104 that overlaps fin 103. Layer 250 may be deposited via, for example, CVD to a depth of approximately 70 nm.

Figure 4:
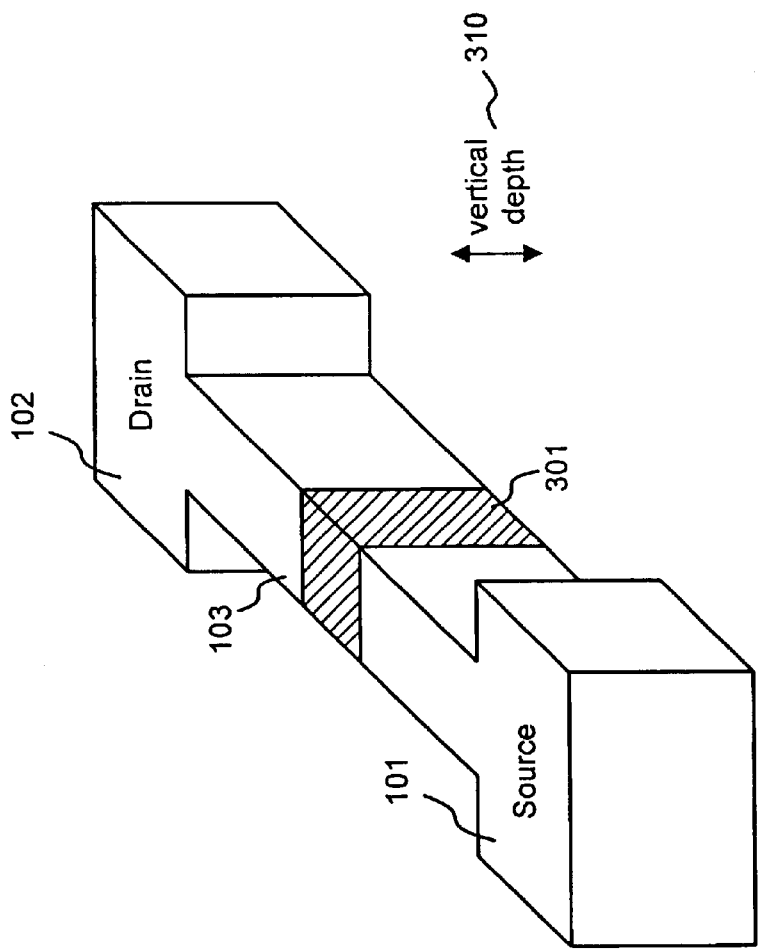
FIG. 4 is a perspective view illustrating the FinFET shown in FIGS. 1–3.

FIG. 4 is a perspective view illustrating FinFET 100 as shown in FIGS. 1 and 2. Source 101, drain 102, and fin 103 of FinFET 100 are shown in FIG. 3. Darkened area 301 represents the area at which the gate material layer 250 is deposited. The direction of the vertical depth within the MOSFET, as used herein, is shown by line 310.

Figure 5:
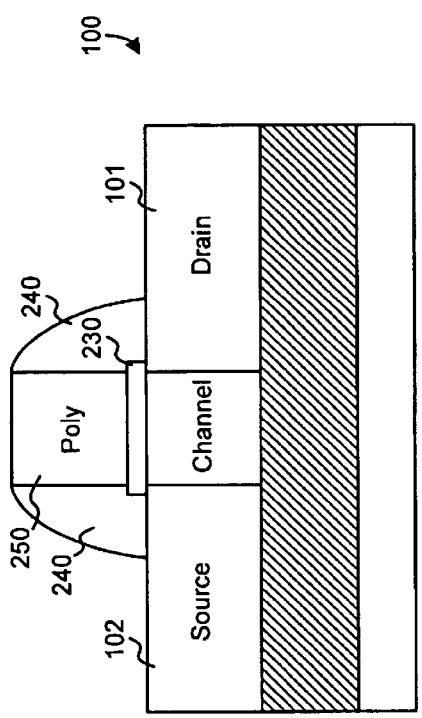

FIG. 5 is a cross-sectional view taken along the line B–B' in FIG. 1. As shown in FIG. 5, $SiO_2$ spacers 240 may be formed around gate material layer 250. Spacers 240 protect the channel area during implantation of source 101 and drain 102.

At this point, FinFET 100 may be implanted with a dopant to dope source 101 and drain 102. For a NMOS device, the dopant may be, for example, $As^+$ or $P^+$. For a PMOS device, the dopant may be, for example, B or $BF_2$. Consistent with an aspect of the present invention, the selected dopant may be deposited in a number of different implantation operations that are set at different tilt angles.

Figure 6:
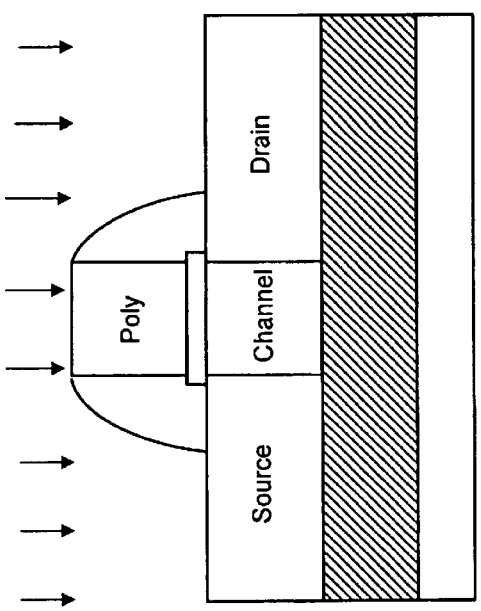

Referring to FIG. 6, a dopant may be implanted on FinFET 100 in which the ions beams are directed orthogonally to BOX layer 220 (i.e., at a tile angle of approximately zero degrees) using an ion beam with the energy that is determined by the fin height and dopant species. For example, with 65 nm fin height, 20 keV phosphorus implant can be used for n+ junction and 8 keV boron can be used for p+ junction. The dopant may then be implanted at a different tilt angle (FIG. 7) and then at yet another tile angle (FIG. 8). In one embodiment, the tilt angles shown in FIGS. 7 and 8 are complimentary angles, such as 45 degrees and 135 degrees. The ion beam for implanting the dopant in FIGS. 7 and 8 may have an energy between approximately 10 keV and 15 keV for phosphorus and between 4 keV and 6 keV for boron for the 65 nm fin height.

By implanting at multiple angles, as shown in FIGS. 6–8, the source 270 junction (FIG. 8) and the drain junction 280 (FIG. 8) are doped relatively uniformly in the vertical direction. This can be advantageous, as it provides for well defined channel length along the width and better short channel control.

One of ordinary skill in the art will recognize that various tilt angles used in implanting FinFET 100 may be used in addition to that shown in FIGS. 6–8. Similarly, although three implantation operations are illustrated, in other implementations, two implantation operations or more than three implantation operations may be used.

Figure 9:
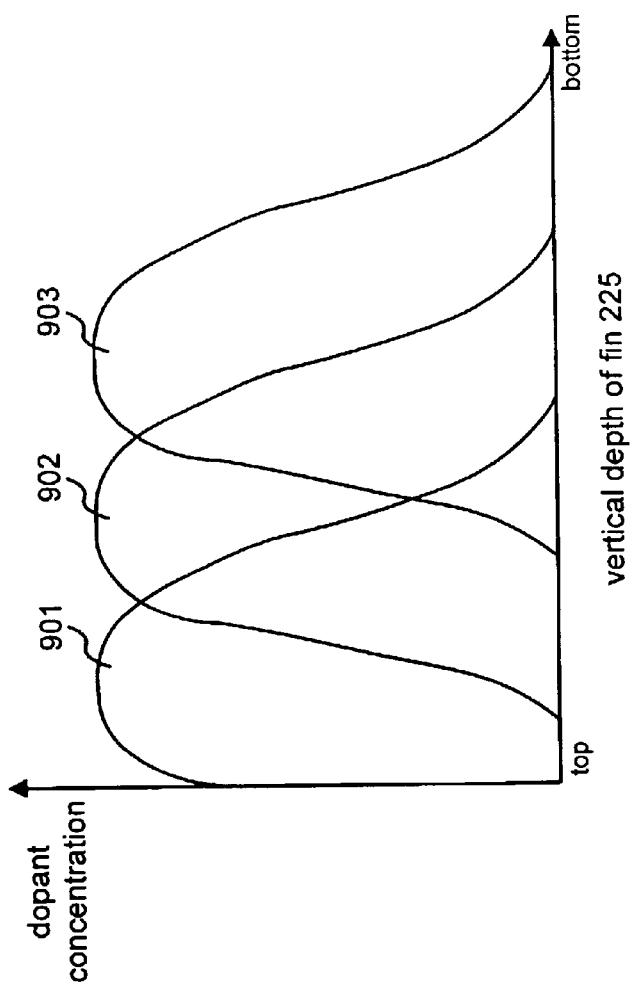
FIG. 9 is a diagram illustrating dopant concentration in a FinFET as a function of vertical depth.

FIG. 9 is a diagram illustrating dopant concentration in the source/drain 101/102 as a function of vertical depth 310 within the fin 225. Curves 901, 902 and 903 represent dopant concentration levels at various depths within FinFET 100 caused by the first, second, and third implantations. Specifically, curve 901 represents dopant concentration caused by the implantation shown in FIG. 6, curve 902 represents dopant concentration caused by the implantation shown in FIG. 7, and curve 903 represents dopant concentration caused by the implantation shown in FIG. 8. As can be seen, due to the multiple tilted implantations, the total dopant concentration along the vertical depth of fin 225 is more uniform than with a single implantation.

Figure 10:
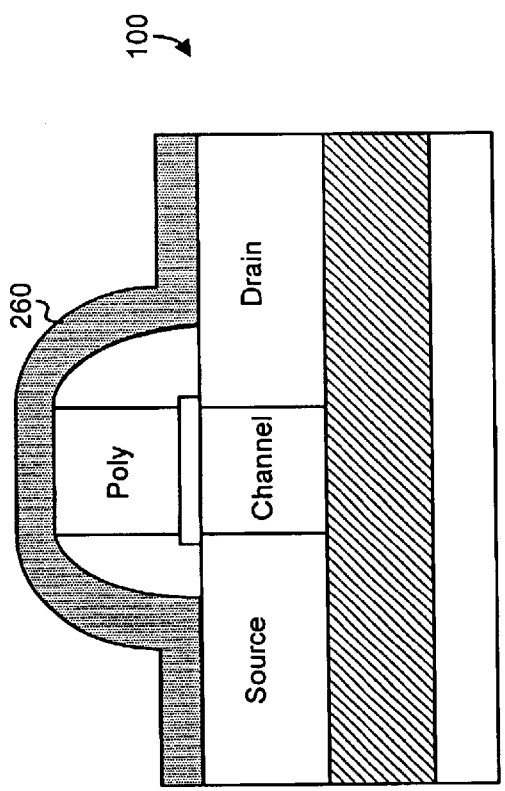
FIGS. 10 and 11 are cross-sectional views taken along the line B–B' in FIG. 1.
Figure 11:
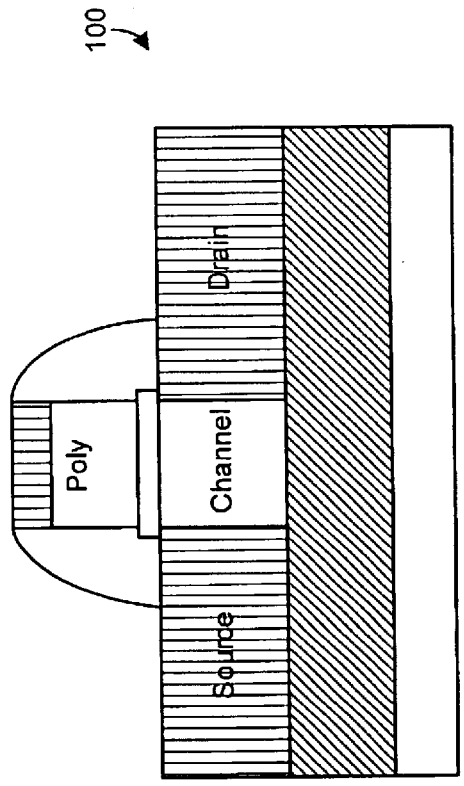

Referring to FIG. 10, a metal layer 260 may next be deposited on FinFET 100. Metal layer 260 may be, for example, tungsten, cobalt, titanium, tantalum, or molybdenum. Metal layer 260 may then be thermally annealed to create a metal silicide compound. FIG. 11 illustrates FinFET 100 after silicidation, in which the silicided areas are shown by vertical cross-hatching.

Additional Disclosure

After applying polysilicon layer 250 (FIG. 3), gate 104 may be patterned. One way to prepare gate 104 for patterning is to first apply a spin-on-glass (SOG) layer to polysilicon 250. SOG is a known interlevel dielectric material that can be applied to a silicon wafer in liquid form.

Figure 12B:
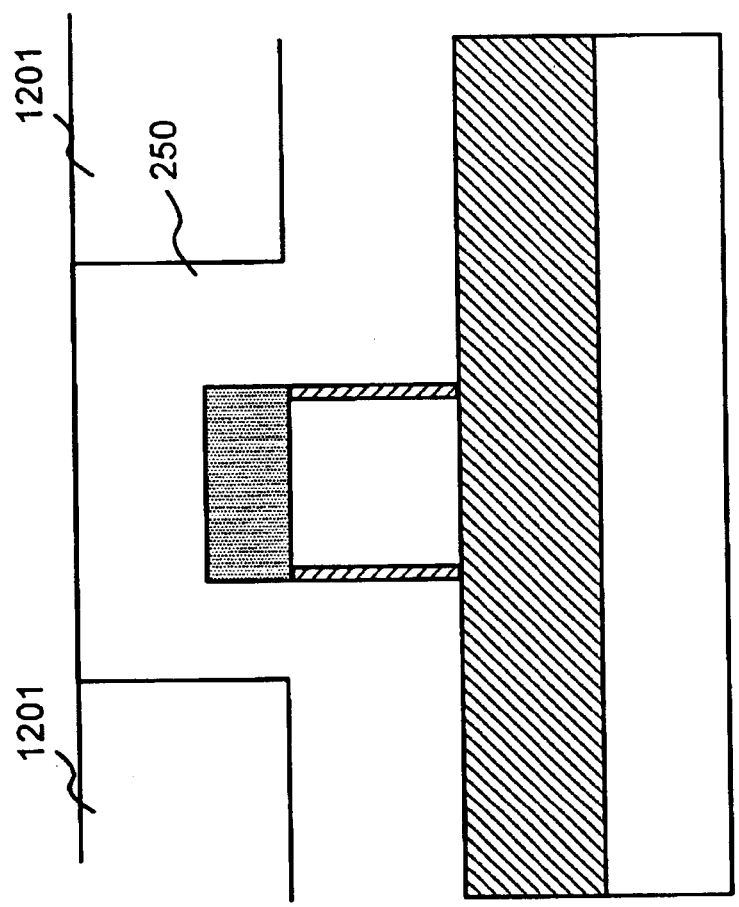

FIGS. 12A and 12B illustrate the application of a SOG layer prior to gate patterning. As shown in FIG. 12A, SOG layer 1201 is applied over polysilicon layer 250. SOG layer 1201 may then be etched back to the level of polysilicon 250 (FIG. 12B). At this point, gate 104 can be patterned over the exposed polysilicon.

Figure 13A:
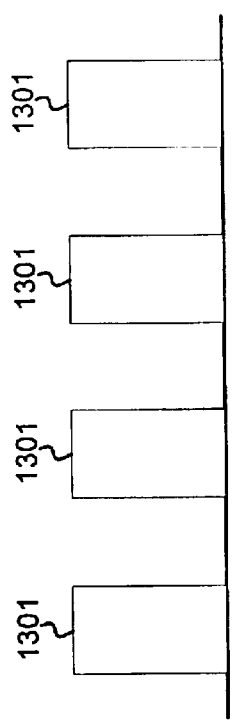
FIGS. 13A–13C are cross-sectional views that illustrate the formation of multiple fins for a FinFET.
Figure 13B:
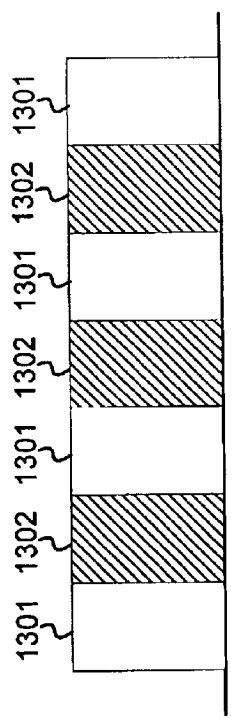
Figure 13C:
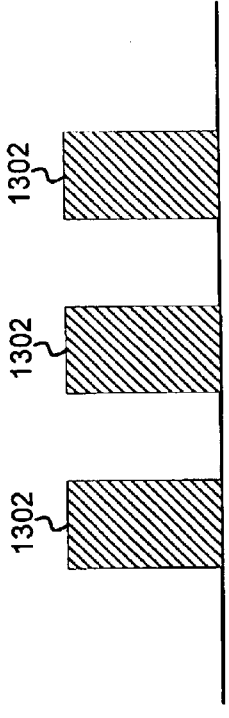

In some FinFETs, it may be desirable to have more than one fin. FIGS. 13A–13C are cross-sectional views taken along a line such as line A–A' (FIG. 1) that illustrate the formation of multiple fins for a FinFET. An oxide layer may first be deposited, patterned, and etched to form oxide "fins" 1301 (FIG. 13A). Silicon may then be deposited in the spaces between oxide "fins" 1302 and planarized (FIG. 13B) to produce silicon fins 1302. The oxide may then be selectively etched away, leaving only the silicon fins 1302 (FIG. 13C).

CONCLUSION

The FinFET described above has a relatively uniform dopant concentration in the source/drain junction. The uniform dopant concentration is achieved through multiple tilted implantations.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques may be employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modification within the scope of the inventive concept as expressed herein.

What is claimed is:

1. A method for forming a MOSFET comprising:

forming a source, a drain, and a fin structure on an insulating layer, portions of the fin structure acting as a channel for the MOSFET;

performing a first implantation with a dopant of the source and the drain; and performing a second implantation with the dopant of the source and the drain, the second implantation being performed at a tilt angle different than a tilt angle of the first implantation and in a same region of the source and drain as the first implantation.

2. The method of claim 1, further comprising:

performing a third implantation with the dopant at a tilt angle different than the tilt angle of the first implantation and the second implantation and in the same region of the source and drain as the first and second implantations.

3. The method of claim 2, wherein the second and third tilt angles are complimentary to one another.

4. The method of claim 1, further comprising:

performing one or more additional implantations with the dopant at tilt angles that are different than the tilt angles of the first implantation and the second implantation and in the same region of the source and drain as the first and second implantations.

5. The method of claim 1, wherein the dopant is an n-type dopant.

6. The method of claim 1, wherein the dopant is a p-type dopant.

7. The method of claim 1, wherein the first implantation deposits the dopant at a tilt angle of approximately zero degrees.

8. The method of claim 7, wherein the second implantation deposits the dopant at a tilt angle of approximately 45 degrees.

9. The method of claim 8, wherein the first implantation is performed using an ion beam implantation technique at approximately 20 keV and the second implantation is performed using an ion beam implantation technique at approximately 15 keV.

10. The method of claim 1, further comprising:

forming $SiO_2$ spacers around the fin structure prior to performing the first implantation and the second implantation.

11. The method of claim 1, wherein the MOSFET is a FinFET.

12. A method comprising:

forming a source, a drain, and a fin structure on an insulating layer, portions of the fin structure acting as a channel for the MOSFET; and implanting the source and the drain with a dopant using a plurality of implantation steps in which each of the plurality of implantation steps is performed at a different tilt angle and in a same region of the source and drain, wherein the plurality of implantation steps cause a concentration of the dopant to be substantially uniform along a vertical depth of a junction of the source and the drain.

13. The method of claim 12, wherein the plurality of implantation steps includes three implantation steps.

14. The method of claim 12, wherein a first of the plurality of implantation steps is performed at a tilt angle of approximately zero degrees.

15. The method of claim 14, wherein a second of the implantation steps is performed at a tilt angle of approximately 45 degrees.

16. The method of claim 15, wherein a third of the implantation steps is performed at a tilt angle complimentary to the tilt angle of the second of the implantation steps.

17. The method of claim 15, wherein the first implantation step is performed using an ion beam implantation technique at approximately 20 keV and the second implantation step is preformed using an ion beam implantation technique at approximately 15 keV.

18. The method of claim 12, wherein the dopant is one of $As^+$ or $P^+$.

19. The method of claim 12, wherein the dopant is one of B or $BF_2$.

20. The method of claim 12, further comprising:

forming $SiO_2$ spacers around the fin structure prior to the implanting the source and the drain.

\* \* \* \* \*